United States Patent [19]
Lowrey et al.

[11] Patent Number: 5,541,872
[45] Date of Patent: Jul. 30, 1996

[54] FOLDED BIT LINE FERROELECTRIC MEMORY DEVICE

[75] Inventors: Tyler A. Lowrey; Wayne I. Kinney, both of Boise, Id.

[73] Assignee: Micron Technology, Inc., Boise, Id.

[21] Appl. No.: 450,916

[22] Filed: May 26, 1995

Related U.S. Application Data

[63] Continuation of Ser. No. 175,923, Dec. 30, 1993, Pat. No. 5,424,975.

[51] Int. Cl.$^6$ .................................................. G11C 11/22
[52] U.S. Cl. .................... 365/145; 365/149; 365/189.09; 365/210
[58] Field of Search .................................. 365/145, 149, 365/210, 189.09

[56] References Cited

U.S. PATENT DOCUMENTS

| | | | |
|---|---|---|---|
| 4,809,225 | 2/1989 | Dimmler et al. | 365/145 |
| 4,873,664 | 10/1989 | Eaton, Jr. | 365/145 |
| 4,888,733 | 12/1989 | Mobley | 365/145 |
| 5,010,518 | 4/1991 | Toda | 365/145 |
| 5,086,412 | 2/1992 | Jaffe et al. | 365/145 |
| 5,218,566 | 6/1993 | Papaliol | 365/145 |
| 5,305,273 | 4/1994 | Jinbo | 365/210 |
| 5,424,975 | 6/1995 | Lowrey et al. | 365/145 |

FOREIGN PATENT DOCUMENTS

| | | | |
|---|---|---|---|
| 0364813 | 4/1990 | European Pat. Off. | 365/145 |
| 0005996 | 1/1991 | Japan | 365/145 |

Primary Examiner—David C. Nelms
Assistant Examiner—Son Dinh
Attorney, Agent, or Firm—Schwegman, Lundberg, Woessner & Kluth, P.A.

[57] ABSTRACT

Described herein is a reference voltage circuit which includes, in combination, a bit line and first and second word line reference transistors connected to the bit line and operative to be turned on with a reference pulse simultaneously with the turning on of the word lines in the main memory circuit. First and second ferroelectric capacitors are connected to each of the first and second word line reference transistors, respectively, and to a source of plate line switching voltage, and a first precharging transistor is connected between the first ferroelectric capacitor and ground potential. A second precharging transistor is connected between the second ferroelectric capacitor and a further source of switching voltage, so that the first and second ferroelectric capacitors are polarized in a ONE and ZERO state in the manner identical to the logic states of the ferroelectric capacitors in the main ferroelectric memory circuit. Thus, when the first and second word line reference transistors turn on, the bit line reference voltage is raised above ground potential by the sum of the voltages of the first and second ferroelectric capacitors. This in turn causes the bit line reference voltage, $\overline{BL}$, to track the voltage variations of the ferroelectric capacitors in the main memory circuit, thus providing improved margins for the BL and $\overline{BL}$ complementary signals which are sensed by a plurality of sense amplifiers for the main memory circuit.

6 Claims, 3 Drawing Sheets

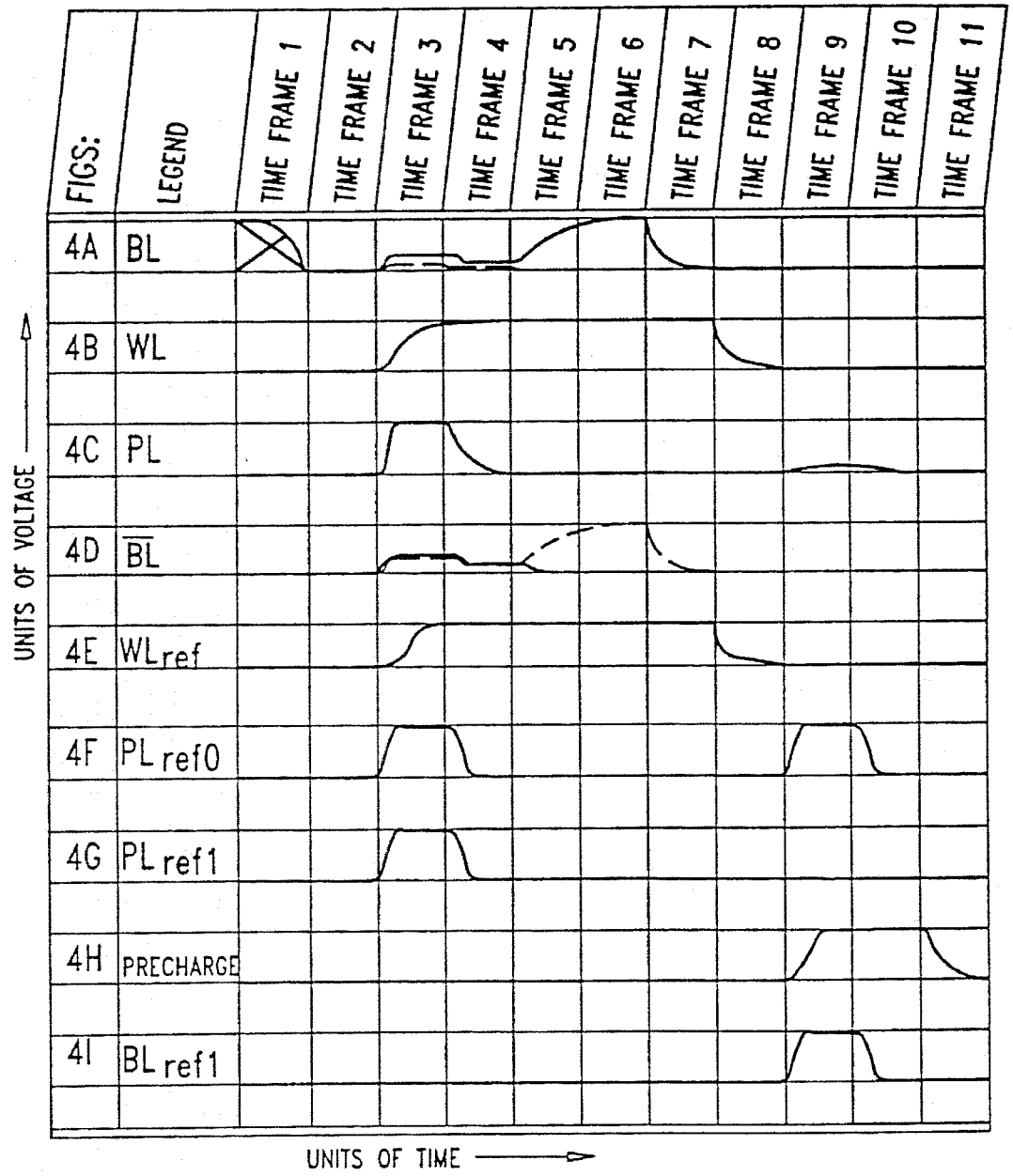

FOLDED BIT LINE FERROELECTRIC MEMORY DEVICE

This is a continuation of application Ser. No. 08/175,923, filed Dec. 30, 1993, now U.S. Pat. No. 5,424,975.

TECHNICAL FIELD

This invention relates generally to ferroelectric memory circuits and more particularly to a novel reference voltage circuit for biasing a sense amplifier used in a ferroelectric memory. This reference voltage tracks the signal from cells in the main memory with respect to variations with temperature, capacitor area, and ferroelectric film properties and enables the use of only one memory cell per bit of stored information. In addition, this reference voltage lies approximately halfway between the signals generated by a "0" state memory cell and a "1" state memory cell. This feature provides maximum margin for sensing either memory cell state.

BACKGROUND ART

Ferroelectric memory arrays are generally well known in the data processing arts and include a plurality of word line rows and a plurality of bit line columns. The rows of word lines normally each include a plurality of metal-oxide-silicon (MOS) access transistors at the juncture of each word line and bit line. In one known type of ferroelectric memory circuit, a ferroelectric capacitor is connected between each access transistor and a plate line, and a sense amplifier is connected to receive two complementary input signals (BIT and $\overline{\text{BIT}}$) from adjacent bit lines extending from a single cell consisting of two access transistors and two ferroelectric capacitors. When appropriate switching voltages are applied to the gates of the access transistors and to the plate lines common to one word line row, the access transistors in this word line are turned on so that the sense amplifier can then read the binary state of the accessed cells. The BIT and $\overline{\text{BIT}}$ signals are then amplified in the sense amplifier, and the sense amplifier determines the voltage and polarity on each adjacent ferroelectric capacitor within a cell. One such circuit is disclosed, for example, in U.S. Pat. No. 4,873,664 issued to Eaton and is incorporated herein by reference.

One disadvantage of the above approach in Eaton is that each cell requires at least two access transistors and two ferroelectric capacitors to generate the required BIT and $\overline{\text{BIT}}$ complementary inputs into the sense amplifier for determining the logical state of the memory cell. This is because the ferroelectric capacitors must be polarized in opposite states to provide a voltage difference on the BIT and $\overline{\text{BIT}}$ inputs to the sense amplifier. The two different memory states are associated with the two different polarities of this voltage difference. Since the charge on each ferroelectric capacitor varies significantly with temperature, capacitor area and ferroelectric film properties, this means that the charge-dependent sense voltage for each ferroelectric capacitor also varies, so that a fixed reference voltage cannot be used with each cell. That is, if one attempted to use a fixed reference voltage for a single transistor-single ferroelectric capacitor cell, the voltage differential between the fixed reference voltage and a logical "1" and a logical "0" on the ferroelectric capacitor would not be sufficiently large under all conditions of operation, e.g. temperature variations, to be detected by the sense amplifier. Normally, this voltage differential must be about 100 millivolts.

Thus, the prior art approach of Eaton requires twice as many transistors and twice as many capacitors and twice as much chip area as compared to a single transistor-single capacitor cell design, and it is the elimination of these latter requirements to which the reference circuit of the present invention is directed.

SUMMARY OF THE INVENTION

The general purpose and principal object of the present invention is to provide a new and improved reference circuit for generating a reference voltage which enables the main memory array of a ferroelectric memory to be constructed using a single transistor and a single ferroelectric capacitor per bit of memory. This feature significantly reduces the complexity of the memory array and also significantly increasing the component density and memory storage capability for a given amount of chip area.

Another object of this invention is to provide a new and improved reference circuit for generating a bit line reference voltage which lies approximately halfway between a "0" and a "1" voltage and which tracks voltage variations with temperature, capacitor area, and ferroelectric properties in the ferroelectric capacitors in a main ferroelectric memory circuit. This reference circuit is connected to provide a bit line reference voltage, $\overline{\text{BL}}$, to a sense amplifier for the main ferroelectric memory circuit.

To accomplish this purpose and objects, there is disclosed and claimed herein a reference voltage circuit for generating a reference voltage for main memory cells utilizing ferroelectric capacitors and including a pair of oppositely charged ferroelectric capacitors. The two capacitors are electrically coupled to a reference voltage bit line via a pair of switching devices which are operative to simultaneously conduct and couple the sum of the charges on the two ferroelectric capacitors onto the reference bit line.

In a more specific embodiment of the invention, there has been developed a reference circuit which includes, in combination, a bit line and first and second word line reference transistors connected to the bit line and operative to be turned on with a reference pulse simultaneously with the turning on of the word lines in the main memory circuit. First and second ferroelectric capacitors are connected to each of the first and second word line reference transistors, respectively, and to a source of plate line switching voltage. A first precharging transistor is connected between the first ferroelectric capacitor and ground potential, and a second precharging transistor is connected between the second ferroelectric capacitor and a source of switching voltage. The first and second ferroelectric capacitors are polarized by this latter switching voltage in a ONE and ZERO state in the manner identical to the polarization of the ferroelectric capacitors in the main ferroelectric memory circuit.

When the first and second word line reference transistors turn on, the bit line reference voltage, $\overline{\text{BL}}$, is raised above ground by the sum of the charges on the first and second ferroelectric capacitors. Since the reference capacitors are made from the same ferroelectric film and are defined at the same time as the ferroelectric capacitors in the main memory, the bit line reference voltage, $\overline{\text{BL}}$, tracks the voltage variations over temperature, capacitor area and ferroelectric properties of the ferroelectric capacitors in the main memory circuit.

The above brief summary of the invention, together with its attendant objects, advantages, and many novel features, will become more readily understood with reference to the following description of the accompanying drawings.

BRIEF DESCRIPTION OF THE DRAWINGS

FIGS. 4A through 4I are a sequence of nine different waveform diagrams for both the reference circuit of FIG. 1 and the ferroelectric memory circuits of FIGS. 2 and 3. The first four (4) waveforms in FIGS. 4A through 4D show the voltages in the main memory circuits of FIGS. 2 and 3 and on the bit line (BL), the word line (WL), the plate line (PL), and the bit line reference voltage ($\overline{BL}$) which is generated by the reference circuit in FIG. 1 and applied as a reference voltage to the circuits of FIGS. 2 and 3. The waveform diagrams in FIGS. 4E through 4I illustrate the voltages at five different nodes indicated by appropriate legend in the reference voltage circuit in FIG. 1.

DETAILED DESCRIPTION OF THE DRAWINGS

Figure 1:
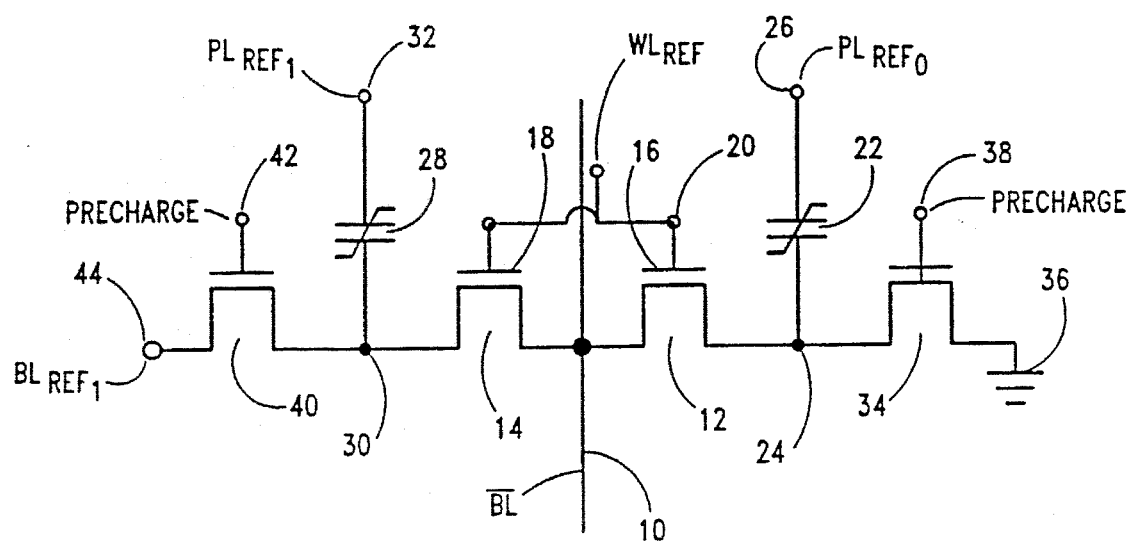
FIG. 1 is a schematic circuit diagram of the reference circuit according to the present invention.

Referring now to FIG. 1, the reference voltage line 10 is also designated as the $\overline{BL}$ line to indicate the signal generated thereon. This reference voltage line 10 is connected to first and second word line reference transistors 12 and 14 whose gate electrodes 16 and 18 are connected to a common word line reference switching voltage, $WL_{ref}$, at node 20. A first ferroelectric capacitor 22 is connected between node 24 and a first plate line reference voltage, $PL_{ref0}$, at node 26. A second ferroelectric capacitor 28 is connected between node 30 and a second plate line reference voltage, $PL_{ref1}$, at node 32. A first precharge transistor 34 is connected to ground potential at node 36 and is further connected to receive a precharge signal at node 38, and a second precharge transistor 40 is connected to receive both a precharge signal at its gate electrode 42 and a bit line reference pulse, $BL_{ref1}$, at node 44. This switching pulse, $BL_{ref1}$, sets the initial charge conditions on the ferroelectric capacitor 28.

The bit line voltage $\overline{BL}$ on line 10 is initially at ground potential and the two word line reference transistors 12 and 14 are turned off initially. Also initially, the first and second ferroelectric capacitors 22 and 28 are charged to opposite polarities by the precharge transistors 34 and 40 upon receipt of a $BL_{ref1}$ input pulse at node 44. Also initially, no plate line reference signal $PL_{ref1}$ or $PL_{ref0}$ is applied to the two nodes 26 and 32 for the two ferroelectric capacitors 22 and 28. Then, at some later time, a pulse $WL_{ref}$ is applied to the common node 20 for the two word line reference transistors 12 and 14 simultaneously with the application of the power supply level pulses $PL_{ref1}$ and $PL_{ref0}$ to the two plate line reference nodes 26 and 32. This causes the sum of the charge stored in the two ferroelectric capacitors 22 and 28 to be coupled through the now conducting word line reference transistors 12 and 14 and dumped onto the bit line 10. The ferroelectric capacitors 22 and 28 must either be one-half the area of the ferroelectric capacitors in the main memory, or the reference bit line 10 must have twice the capacitance of the bit lines 56, 58, and 60 in the main memory.

The $\overline{BL}$ voltage on the bit line 10 will be halfway between the voltage stored on all ferroelectric capacitors in the main memory having a logical ONE (1) stored therein and all ferroelectric capacitors in the main memory having a logical ZERO (0) stored therein. This feature in turn provides a temperature compensated reference voltage for the bit lines and the sense amplifiers in the main memory circuits.

Figure 2:
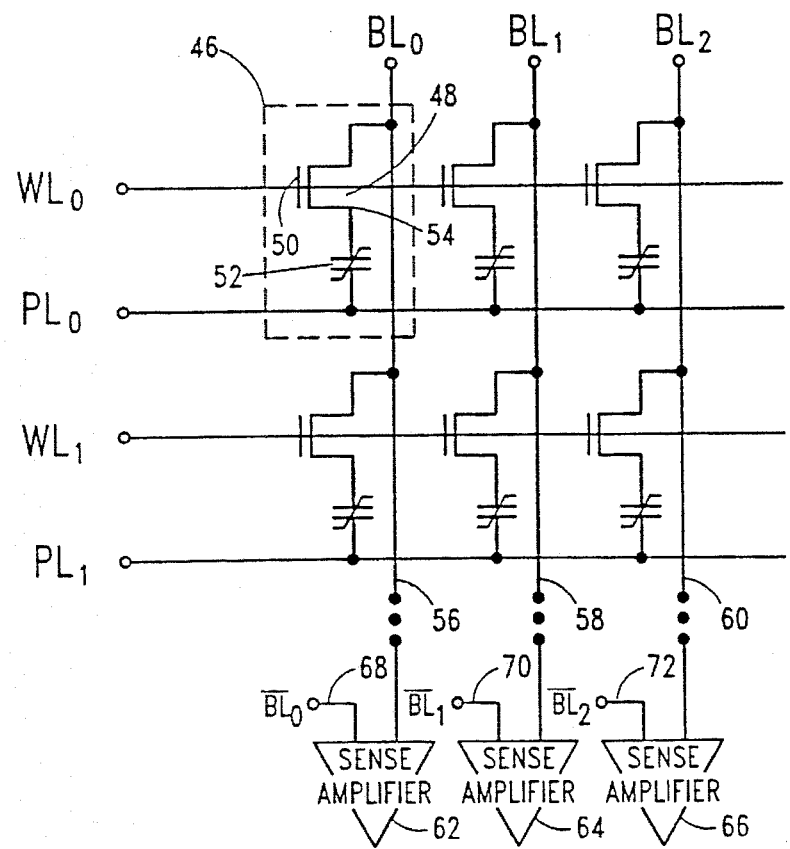
FIG. 2 is a schematic circuit diagram of one type of ferroelectric memory circuit with which the reference circuit of FIG. 1 may be used.

Referring now to FIG. 2, there is shown one type of ferroelectric memory circuit with which the present reference voltage circuit is used. The circuit in FIG. 2 is known in the are as an open bit line circuit and is more susceptible to electrical noise than the memory circuit in FIG. 3, but can be constructed with a higher component density than the folded bit line architecture in FIG. 3. The memory circuit of FIG. 2 is shown with only two word lines $WL_0$ and $WL_1$, two plate lines $PL_0$ and $PL_1$, and three BIT lines $BL_0$, $BL_1$, and $BL_2$, but these circuits in both FIGS. 2 and 3 will in practice have a larger plurality of these lines. Each cell 46 in the memory includes a single access transistor 48 having its gate electrode 50 connected to a word line, e.g., $WL_0$, and a ferroelectric capacitor 52 connected as shown between the drain electrode 54 of the access transistor 48 and a plate line voltage, e.g. $PL_0$.

Five additional and identical unnumbered cells are shown in the symmetrical architecture and layout of FIG. 2, and the bit lines for each cell, $BL_0$, $BL_1$, and $BL_2$, are connected to the bit line 10 of a separate reference circuit of the type shown in FIG. 1. These bit lines $BL_0$, $BL_1$, $BL_2$, etc. are also connected as one input 56, 58, and 60 to the three sense amplifiers 62, 64, and 66. The other inputs 68, 70, and 72 of the three sense amplifiers 62, 64 and 66 are each connected to receive the $\overline{BL}$ reference voltage from node 10 in separate reference circuits as shown in FIG. 1. In operation, the small differential signal seen by these sense amplifiers is latched up to the full zero and Vcc logic swing, which will typically be 5.0 volts Vcc when reading the logical state of a particular cell.

Figure 3:
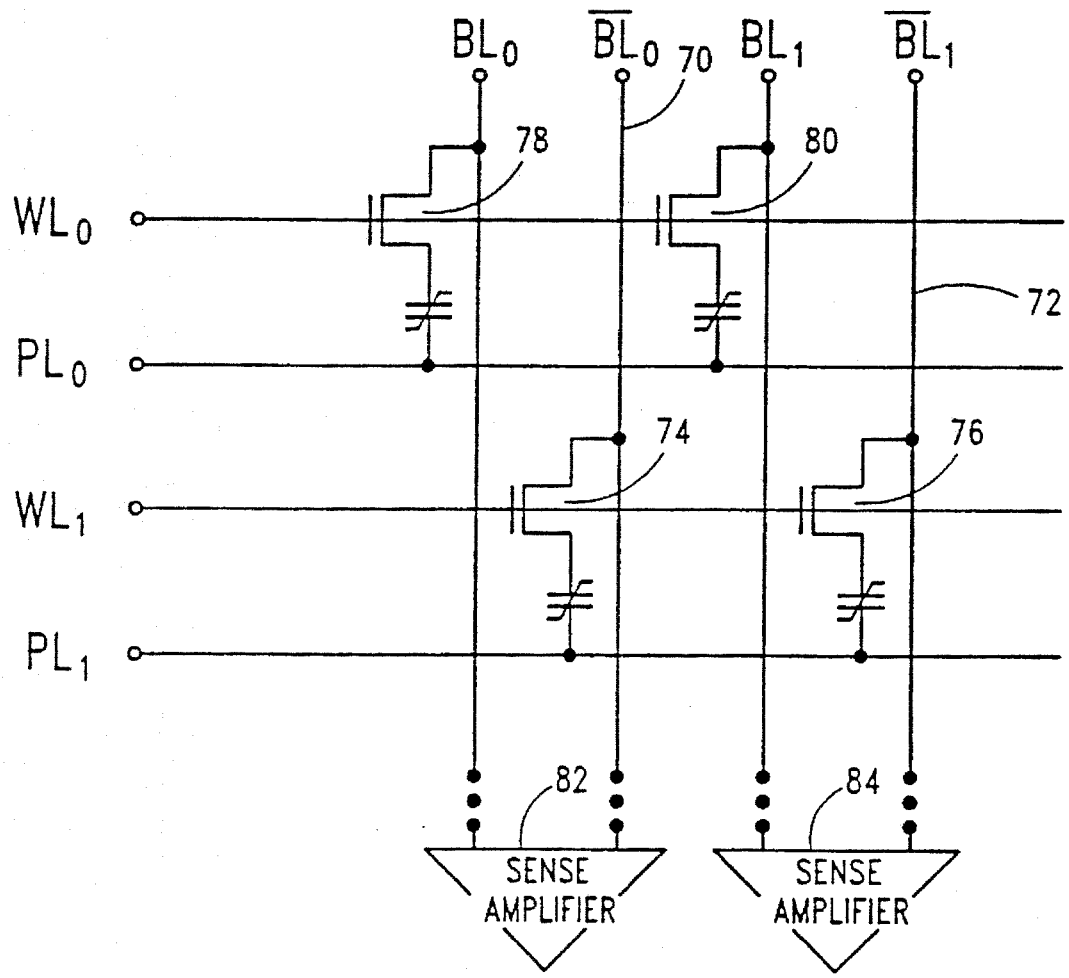
FIG. 3 is a schematic circuit diagram of a second type of ferroelectric memory circuit with which the reference circuit of FIG. 1 may be used.

Referring now to FIG. 3, the architecture shown in this figure is known in the data processing arts as a folded bit line architecture, and is not as susceptible to electrical noise as is the open bit line architecture in FIG. 2. That is, due to the close spacing of these cells, good common mode rejection is provided. Every other bit line, 70 and 72, is connected to the even numbered transistors 74 and 76 to receive the $\overline{BL}$ reference signal from the reference circuit of FIG. 1, whereas the sources of the odd numbered transistors and 78 and 80 are connected to the BIT lines labeled $BL_0$ and $BL_1$. $BL_0$ and $\overline{BL_0}$ are thus compared in the sense amplifier stage 82, and $BL_1$ and $\overline{BL_1}$ are compared in the sense amplifier stage 84.

Referring now to FIGS. 4A through 4I, the bit line signal BL can be in any state in the first time frame in FIG. 4A, and in the second time frame in FIG. 4B, the bit line, BL, is floating at ground potential. In the third time frame, the word line signal, WL, and the plate line signals, PL, in FIGS. 4B and 4C are driven high, thereby driving the bit line signal BL to one of its two positive states indicated by the dotted and solid lines in FIG. 4A, depending upon whether the ferroelectric capacitor in a given cell is in a logical ONE or logical ZERO state.

Simultaneously, in the third time frame, the $WL_{ref}$ signal, the $PL_{ref0}$ signal, and the $PL_{ref1}$ signal in FIGS. 4E, 4F, and 4G are all driven high, thereby causing $WL_{ref}$ to turn on the two MOS transistors 12 and 14 in the reference voltage circuit and cause the sum of the charges on the two ferroelectric capacitors 22 and 28 to be dumped on the bit line 10 in the reference voltage circuit. This switching action in turn causes the bit line reference signal, $\overline{BL}$, in FIG. 4D to be driven halfway between the two levels of bit line voltage BL in FIG. 4A, thereby placing the $\overline{BL}$ reference voltage halfway between the two voltage levels for the two logical states, ZERO and ONE, for each ferroelectric capacitor in the main memory. In the third time frame, the plate line voltages in FIGS. 4F and 4G are also driven high.

In the fourth time frame, the plate line voltages $PL_{ref0}$ and $PL_{ref1}$ in FIGS. 4C, 4F, and 4G are all removed, and the sense amplifiers then latch the small differential voltages BL and $\overline{BL}$ up to the full logical levels as previously indicated in the fifth and sixth time frames. Thereafter, the BL signal in FIG. 4A, and the $\overline{BL}$ reference signal in FIG. 4D are discharged to ground potential in time frame 7, and the word line signal WL in FIG. 4B and the word line reference signal $WL_{ref}$ in FIG. 4E are removed in time frame 8. Then, the next three time frames 9, 10, and 11 show the precharging of the reference voltage circuit as indicated by the $PL_{ref0}$ pulse in FIG. 4F and the precharging pulses $BL_{ref1}$ and "Precharge" in waveforms 4H and 4I in preparation for another cycle.

Various modifications may be made in and to the above described embodiments without departing from the scope of the present invention. For example, the ferroelectric capacitors can be made of the same size as the ferroelectric capacitors in the main memory by doubling the length of the bit line, or they can be made one-half the size of the ferroelectric capacitors in the main memory. In a preferred embodiment of the invention, all of the ferroelectric capacitors are the same size.

In addition, it should be understood that the main memory circuits of FIGS. 2 and 3 are merely two of many different types of memory circuits with which the reference circuit of FIG. 1 may be used. Also within the scope of this invention, it may be possible to use a single reference circuit of the type shown in FIG. 1 for all of the bit lines shown in both FIGS. 2 and 3. This proposed circuit would require the use of some form of electrical isolation, such as a voltage follower or unity gain amplifier, connected between the bit line 10 in FIG. 1 and all of the bit lines in FIGS. 2 and 3, respectively, in order to prevent variations in loading in these main memory arrays from affecting the bit line voltage on line 10 in the reference voltage circuit. Accordingly, these and other circuit and design modifications are within the scope of the following appended claims.

We claim:

1. A ferroelectric memory device having a folded bit line architecture, comprising, a first memory cell having a first ferroelectric capacitor having a first plate and a second plate, the first plate being coupled to a first plate line and the second plate being coupled to a first bit line through a single first access transistor, the first access transistor being controlled by a first word line, and a second memory cell having a second ferroelectric capacitor having a third plate and a fourth plate, the third plate being coupled to a second plate line and the fourth plate being coupled to a second bit line through a second access transistor, the second access transistor being controlled by a second word line, a sense amplifier having a first input selectively coupled to the first bit line and having a second input selectively coupled to the second bit line, having a reference source selectively coupled to the first input when the second input is coupled to the second bit line and having the reference source selectively coupled to the second input when the first input is coupled to the first bit line; and means for pulsing the first and second plate lines when the reference source is coupled to either the first or second inputs of the sense amplifier.

2. The ferroelectric memory device according to claim 1 wherein the reference source comprises a pair of oppositely charged ferroelectric capacitors which are electrically coupled to a reference voltage bit line via a pair of switching devices which are operative to conduct and couple the sum of the charges on the ferroelectric capacitors onto the reference bit line wherein the ferroelectric capacitors are connected to separate plate line voltages.

3. The circuit defined in claim 2 wherein the ferroelectric capacitors in the reference source are the same size as the first and second ferroelectric capacitors, and the length of the first bit line is doubled when the reference source is attached to the first bit line.

4. The circuit defined in claim 2 wherein the ferroelectric capacitors in the reference source are one-half the size of the first and second ferroelectric capacitors.

5. A method of sensing the bit value in a ferroelectric memory device having a folded bit line architecture, comprising the steps of:

accessing a first ferroelectric capacitor by simultaneously pulsing a plate line and enabling a first access transistor via a first word line to connect the ferroelectric capacitor to a first bit line;

preventing access to a second ferroelectric capacitor by disabling a second access transistor via a second word line to prevent the second ferroelectric capacitor from being connected to a second bit line:

placing the reference voltage on the second bit line; and differentially comparing a voltage on the first bit line to the reference voltage of the second bit line.

6. The method according to claim 5, wherein the step of placing the reference voltage on the second bit line, comprises the substeps of:

placing a first polarization on a third ferroelectric capacitor;

placing a second polarization opposite of the first polarization on a fourth ferroelectric capacitor; and accessing the third ferroelectric capacitor and the fourth ferroelectric capacitor and coupling the third ferroelectric capacitor and the fourth ferroelectric capacitor to the second bit line to produce the reference voltage on the second bit line.

* * * * *